US007091728B2

(12) United States Patent
Drouin et al.

(10) Patent No.: US 7,091,728 B2
(45) Date of Patent: Aug. 15, 2006

(54) VOLTAGE ISOLATED DETECTION APPARATUS AND METHOD

(75) Inventors: Guy Drouin, Quebec (CA); Martin Beaumont, Sainte-Foy (CA); René Goulet, Ancienne-Lorette (CA)

(73) Assignee: GENCSUS, Schenectady, NY (US)

( * ) Notice: Subject to any disclaimer, the term of this patent is extended or adjusted under 35 U.S.C. 154(b) by 0 days.

(21) Appl. No.: 10/926,994

(22) Filed: Aug. 27, 2004

(65) Prior Publication Data

US 2006/0043981 A1  Mar. 2, 2006

(51) Int. Cl.
*G01R 27/08* (2006.01)
*G01R 31/08* (2006.01)

(52) U.S. Cl. .................................. 324/713; 324/522

(58) Field of Classification Search ............... 324/456, 324/713, 522
See application file for complete search history.

(56) References Cited

U.S. PATENT DOCUMENTS 5,264,982 A * 11/1993 Cox et al. .................... 361/144
6,580,783 B1 * 6/2003 Swale ....................... 379/26.01
6,900,643 B1 * 5/2005 Deng et al. ................. 324/522

* cited by examiner

*Primary Examiner*—Anjan Deb
*Assistant Examiner*—Amy He
(74) *Attorney, Agent, or Firm*—Baker & Hostetler LLP

(57) ABSTRACT

A high-isolation call cord switch includes connectivity for a standard hospital-style push-button call cord while using low voltage alternating current to isolate detection circuitry from static electricity. An alternating current signal is used to permit transformer coupling, with its intrinsic isolation capability, between the call cord switch and the detection circuit.

15 Claims, 4 Drawing Sheets

VOLTAGE ISOLATED DETECTION APPARATUS AND METHOD

FIELD OF THE INVENTION

The present invention relates generally to sensing electronics. More particularly, the present invention relates to voltage-isolated detection circuits for communication in controlled environments.

BACKGROUND OF THE INVENTION

Circuit protection and bidirectional electrical isolation are strongly desirable attributes of electrical circuits likely to be exposed to outside stresses as well as to electrical circuits with the potential to introduce hazards. Examples of outside stresses include electrostatic discharge (ESD) events from such sources as lightning, other natural events, and human contact. Examples of hazards potentially able to be introduced by electronic circuits include interference with medical test results and causation of sparks that can ignite flammable mixtures such as medical gases mixed with air or oxygen.

One area of particular interest is ESD events that occur in nominally sheltered areas such as buildings, and particularly those occurring in locations such as hospitals and other care facilities. ESD is caused by separation of similar materials, such as peeling a strongly insulating material like polyethylene film from a roll; by repeated rubbing between differing materials, such as the classic rabbit fur and amber rod demonstration; and by many everyday events such as walking across a linoleum floor in leather-soled shoes. ESD is gauged by voltage and available energy storage, and by such factors as the humidity-dependent conductivity of air, which factors contribute to a determination of the distance a spark can leap.

ESD events are diminished by bleeding off static charge through ameliorative strategies, such as replacing static-promoting furniture, clothing, bedding, and carpets with dissipative types, applying carefully formulated waxes to linoleum floors, adding extra water to dry air, and the like. However, the complete elimination of ESD is seldom practical. A balanced approach to ESD control combines amelioration strategies with electronic circuit designs that increase immunity of circuits to damage due to those ESD events that are not successfully suppressed.

Several ESD models exist to permit and verify successful apparatus design for the prevention of damage. Typical ESD models include combinations of voltage levels, energy storage levels (capacitance), and pulse rise time to emulate one or more modes analogous to such events as a human walking across a static-promoting floor in dry weather and touching a test subject device with a finger. Since established ESD models generally use voltage levels well below 100 kilovolts (KV), that level is a useful threshold for developing an apparatus that is substantially ESD resistant.

In general, circuit designs that have heightened intrinsic ESD immunity are desirable in comparison to lower ESD immunity circuits. Tradeoffs between such devices in order to enhance survivability in normal use involve such issues as higher power consumption, slower response time, diminished accuracy, and higher cost. Thus, any circuit improvement that can potentially improve ESD immunity with minimal penalties may be viewed with great interest.

In particular, in a hospital setting, a human interface device such as a call cord apparatus may be viewed as a candidate for improved ESD protection. A call cord is a device used at a hospital bed and elsewhere, typically electrically connected to a wall-mounted electrical enclosure. The call cord, itself, is, in some embodiments, a wire pair ending at the wall end in a plug and at the opposite end in a handle with a pushbutton switch. A call cord is typically used by a patient to request the attention of an attendant. Because the call cord contains conductive components and is covered in insulating material, adding a requirement for ESD dissipative qualities is an undesirable imposition on the design of the call cord itself.

A further call cord restriction that requires consideration is the possibility that the call cord itself could be a source of physical hazard. A spark of any size occurring exterior to or within a call cord, such as a spark associated with a switch closure, is potentially capable of causing electrical interference with devices in its immediate vicinity. In addition, an improperly configured call cord could be a source of undesirable arcing.

Accordingly, it is desirable to provide a method and apparatus that allow a call cord-type switch for use in a hospital grade wall-mount signal annunciator to operate in an essentially normal mode, while establishing an ESD immunity threshold on the order of 100 Kilovolts and providing substantial immunity from spark generation.

SUMMARY OF THE INVENTION

The foregoing needs are met, to a great extent, by the present invention, wherein in one aspect an apparatus is provided that in some embodiments provides a method and apparatus that allow a call cord-type switch in a hospital grade wall-mount signal annunciator to operate in an essentially normal mode, while establishing an ESD immunity threshold on the order of 100 Kilovolts and providing substantial immunity from spark generation.

In accordance with one embodiment of the present invention, a detection circuit is presented. The detection circuit comprises a transformer primary circuit and a transformer secondary circuit. The transformer primary circuit further comprises an alternating-current signal (AC) source, an impedance in series with the AC source, and a transformer primary winding in series with the AC source and the impedance. The transformer primary circuit establishes an electrical circuit by completing a signal path to the AC source. A detector is positioned across one of the impedance and the primary winding. The transformer secondary circuit further comprises a transformer secondary winding magnetically coupled to the primary winding, and a plurality of load devices switchably connected across the secondary winding one of not at all, individually, and in combination.

In accordance with another embodiment of the present invention, a detection circuit is provided. The detection circuit comprises means for generating a generally sinusoidal signal applied to a series string comprising a impedance and a transformer primary winding, means for detecting positioned across one of the impedance and the transformer primary winding, means for detachably coupling a first load across a transformer secondary winding magnetically coupled to the transformer primary winding, and means for detachably coupling a second load across the transformer secondary winding.

In accordance with yet another embodiment of the present invention, a method for monitoring a call cord is provided. The method comprises the steps of generating a generally sinusoidal signal across a series string comprising a impedance and a primary winding of a transformer, detecting a voltage across one of the impedance and the primary winding of the transformer, isolating a secondary winding of the transformer from the primary winding of the transformer, detachably switching a first load across the secondary winding of the transformer, wherein the secondary winding is magnetically coupled to the primary winding of the transformer, and detachably switching a second load across the secondary winding of the transformer.

There have thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as in the abstract, are for the purpose of description and should not be regarded as limiting.

As such, those skilled in the art will appreciate that the conception upon which this disclosure is based may readily be used as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

Figure 1:
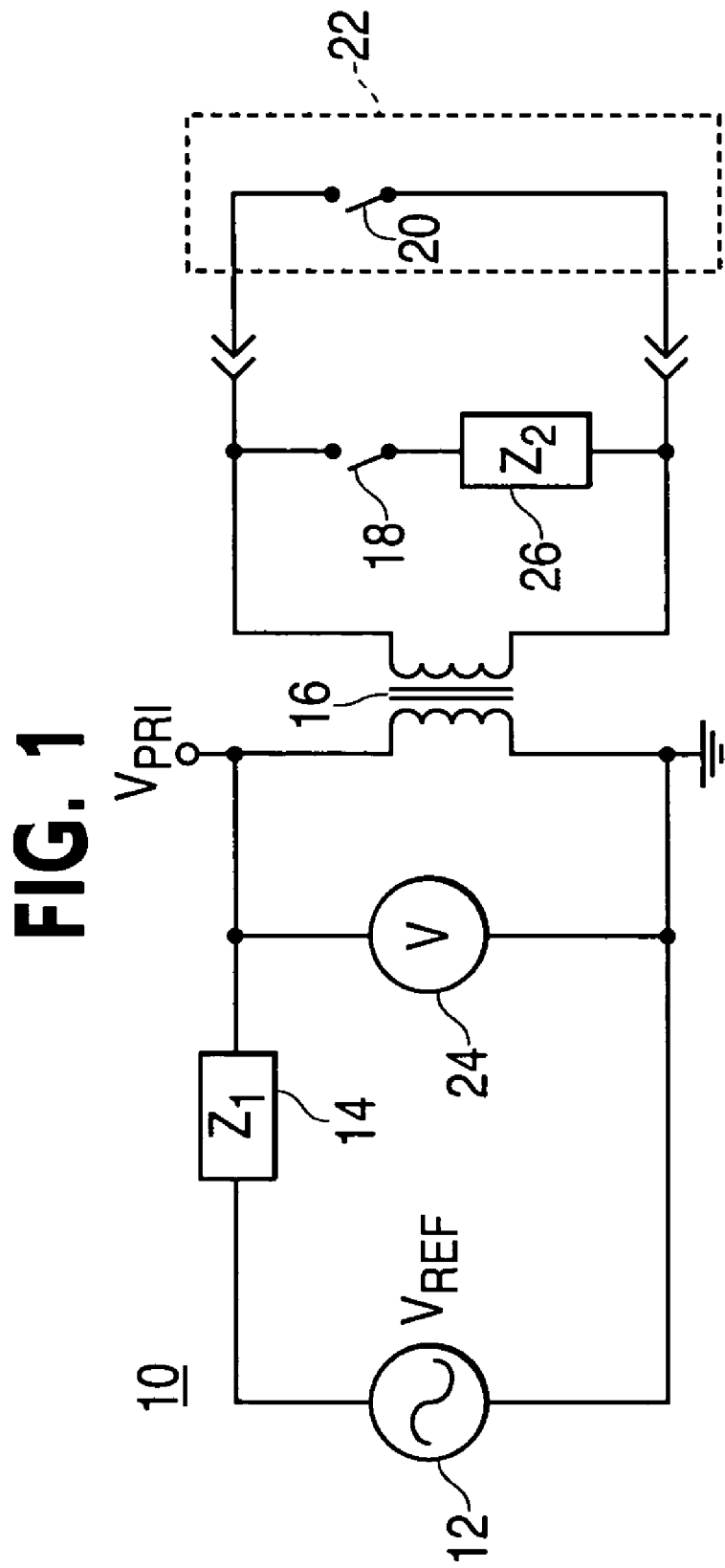
FIG. 1 is a block diagram of the detector according to a preferred embodiment of the invention.

The invention will now be described with reference to the drawing figures, in which like reference numerals refer to like parts throughout. An embodiment in accordance with the present invention provides an impedance element, such as a fixed resistor, and a transformer primary winding. The pair functions as a load, wired in series, and is driven by an alternating current (AC) source, preferably characterized by low power output and low output impedance. The output of the AC source is preferably a sinusoidal steady state signal. In general, a signal source loaded by a series combination of load devices, such as an impedance element and a transformer primary winding, where the transformer primary winding has transformer coupling to at least one secondary winding, exhibits voltage division between the load devices. A detector placed across either the impedance element or the transformer primary winding detects a waveform similar to that of the AC source, scaled according to the division ratio between the two load devices and altered in phase by the reactive component of the impedance of each load device.

The circuit into which the secondary winding of the transformer is wired couples to the primary winding. For example, if the secondary is an open circuit, the waveform in the primary circuit will cause the detector to sense a particular signal, from which can be extracted a DC voltage, the magnitude of which is proportional to the impedance ratio of the impedance element and the coupled transformer components. Placing a resistive or reactive load or a short circuit across the transformer secondary winding will change the primary-circuit AC output level. This primary-circuit AC output level is detected, conditioned, and used as an input to other electronic circuits.

FIG. 1 illustrates an embodiment of the present inventive apparatus. For a detector primary circuit 10, a sine wave generator 12 drives an impedance 14 and the primary of a transformer 16. In the mode shown, both a first switch 18 and a second switch 20 are open, corresponding to an unplugged call cord 22. A voltmeter 24, which serves here as a generic detector, detects a baseline AC voltage $V_{PRI}$. When the call cord 22 is plugged in, the first switch 18 is closed, which, by transformer coupling, inserts a second load device 26 into the primary circuit, with an impedance scaled by the square of the turns ratio of the transformer 16. The effect of this coupling, for any real (i.e., resistive) impedance, is to draw down the AC voltage $V_{PRI}$ at the voltmeter 24. When a call cord 22 pushbutton is pressed, the second switch 20 is closed, causing the voltage across the transformer 16 primary winding to drop nearly to zero. The voltmeter 24 in FIG. 1 converts each of these conditions to a logic signal.

Transformers of various construction styles may be advantageous for different embodiments of the inventive apparatus. Ferrite core, iron core, and nonferromagnetic core such as air core are some of the potentially useful constructions. Windings in the form of printed circuit tracks on circuit boards constitute one of the types that may be useful in some embodiments.

The configuration shown provides isolation to the extent that the transformer 16 has isolated primary and secondary windings. Isolation of primary from secondary windings can be realized in a variety of ways. For example, ordinary enameled magnet wire wound with bifilar windings provides isolation to the extent of the breakdown voltage of two layers of wire insulation. If the two windings are wound onto opposite sides of a toroidal core, then the breakdown voltage may be a function of the air gap between the windings as well as the breakdown voltage characteristic of the wire insulation. If the two coils are wound on a multiaperture core or on two separate bobbins fitted onto a split core, then for some core designs the level of isolation can be increased further still.

A particularly useful core style in a preferred embodiment is a ferrite (powdered iron and other metal oxides and ceramic binders) core in an "E" shape with a ferrite plate assembled onto and closing the open legs of the "E". This transformer core style can be made in various sizes, and can provide acceptable coupling even for small signals using large core sizes. The wiring for the transformer in the preferred embodiment is wrapped on bobbins that fit closely on the outer legs of the "E". The potentially large size of the core affords large gaps for ESD isolation—that is, where there is a relatively large physical distance between materials at different static potentials, a higher voltage is required to cause an arc, so the arc is less likely to occur, while slow, usually harmless bleedoff of the charge becomes more likely.

It may be observed that the effect of a voltage spike due to ESD, if applied to one terminal of the transformer 16 secondary, may cause a differential-mode voltage pulse or glitch to be coupled back into the detection circuit. However, if the transformer 16 is configured for operation in the vicinity of the audio band (that is, at frequencies generally above 120 Hz and generally below 100 KHz), the largest proportion of an ESD pulse will fail to couple through the windings of the transformer 16. Similarly, isolation afforded between the windings can largely prevent an ESD pulse from coupling from secondary to primary as a common-mode static pulse.

Further enhancement can be provided by adding transient suppressive devices such as spark gaps or transient suppression diodes to the primary and/or secondary circuits, as well as rise time-limiting devices such as series resistor-capacitor networks.

ESD pulse transmission from primary to secondary is also generally inhibited by the isolation afforded by the transformer, which isolation can be further enhanced by the turns ratio of the transformer being made comparatively large, such as 10:1 or 100:1, with the primary on the high voltage side and the secondary on the high current, low voltage side. Such a configuration permits the call cord 22 to be operated at a reduced voltage level and thereby generally reduces the possibility for appreciable signal radiation from the call cord 22 acting as an antenna.

Figure 2:
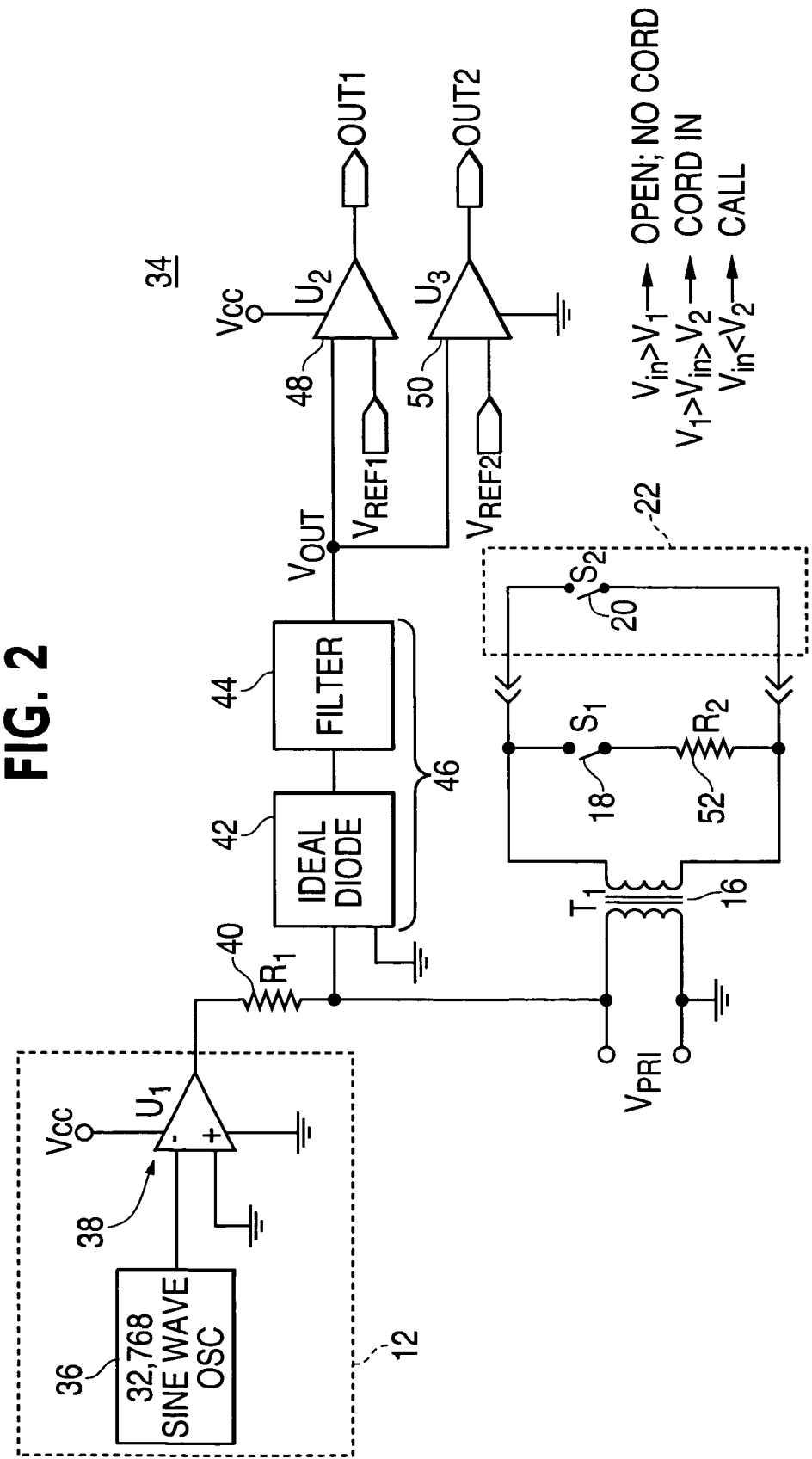
FIG. 2 is an overall schematic diagram of a preferred embodiment of the invention.

FIG. 2 is a circuit diagram 34 showing the features of an embodiment of the invention in analog form. Here, the AC source 12 includes an oscillator 36 followed by a buffer/driver 38. The generic impedance device 14 of FIG. 1 is seen to be a resistor 40 chosen to have a value in a desired range.

In other embodiments, a device other than a resistor 40 may be useful for the impedance device 14. Such devices may include capacitors, semiconductor devices such as constant-current diodes or zener diodes, networks of passive (R/L/C) components, and other circuit configurations as dictated by system requirements or user preference. The fixed resistor 40 is effective in the AC circuit of the embodiment shown.

The transformer 16 and call cord-side circuit components in FIG. 2 are arranged in the same general fashion as those shown previously in FIG. 1. The detector 42 is shown to be a circuit device known variously by such names as a high-speed rectifier, an ideal diode, and an AM demodulator. The output of this circuit is shown to drive a filter 44, the combination of which with the high-speed rectifier is known as an averaging detector 46. To distinguish more clearly between the overall circuit and the subcircuit, the term ideal diode 42 will be used hereinafter.

The averaging detector 46 output is a voltage corresponding to the envelope of the AC source 12 as affected by load variations. If the AC source 12 has an output that is substantially constant, then the switching of the cord detect switch 18 by inserting the call cord 22 divides the input signal, lowering the ideal diode 42 input $V_{PRI}$ and thereby the averaging detector 46 output $V_{OUT}$. Activating the call cord switch 20 will further load the circuit, lowering the averaging detector 46 output further still.

The output $V_{OUT}$ of the averaging detector 46, shown in FIG. 2, is fed to a first comparator 48 and a second comparator 50, the reference voltages for which are chosen to allow the first comparator 48 to trip at a first voltage threshold $V_{REF1}$ and the second comparator 50 to trip at a second voltage threshold $V_{REF2}$. When the call cord 22 is unplugged, the voltage is high enough that neither comparator 48 nor 50 is tripped, producing a logic output for the first comparator 48 and second comparator 50 of [0,0].

When the call cord 22 is plugged in, but its button is not pressed, closure of the first switch 18 divides the AC signal between the first resistor 40 and the second resistor 52 as scaled by the square of the transformer 16 turns ratio. Activation of the first comparator 48 but not the second 50 produces a logic output of [1,0].

When the switch 20 on the call cord 22 is activated, a substantially short circuit is applied to the secondary of the transformer 16. Scaled by the square of the transformer 16 turns ratio, this short appears effectively as a short in the primary-side AC voltage divider, reversing the state of the second comparator 50, and producing an output signal of [1,1].

Each of the logic states can be used to control system functions, such as by generating a "system operational" signal and a "system operational and activated" signal.

It may be observed that considerations such as loop gain and diode polarity in the ideal diode 42 may be changed, which can in some configurations reverse the operation of the comparators. Similarly, configuring the ideal diode 42 across the resistor 40 instead of from the transformer 16 primary winding to ground reverses the polarity of the changes that occur due to circuit operation. System design considerations such as a requirement for additional DC power supplies in some configurations when compared to others may be factors in selecting an embodiment.

Figure 3:
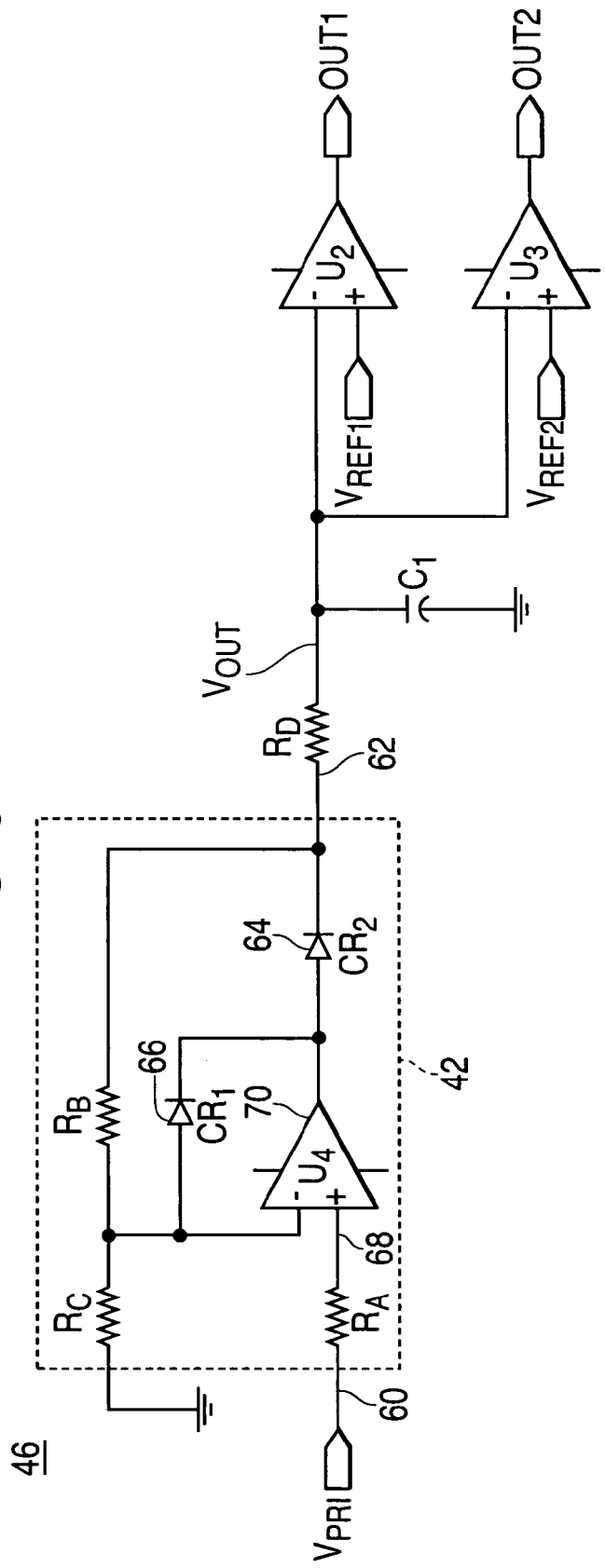
FIG. 3 is a detailed schematic diagram of a specific section of the invention.

FIG. 3 is a schematic of the detector 46. A voltage $V_{PRI}$ present at the input 60 to the detector 46 circuit causes a swing of the same polarity at the detector output 62. With the diodes 64 and 66 in the feedback loop of the ideal diode 42 in the polarity shown, positive input swings with respect to a DC reference voltage level at the noninverting input 68 of the operational amplifier 70 appear at the output 62, while negative input swings reverse-bias the diode 64 and forward bias the diode 66 and produce zero output. Output signal magnitude is a function of gain and is controlled (for positive signals) by the values of the resistors $R_B$ and $R_C$, according to the formula $V_{OUT}=V_{PRI}*(1+(R_B/R_C))$, neglecting any effects of the $R_D/C_1$ filter and any loading by the inputs to comparators $U_2$ and $U_3$. With the noninverting detector 46 design as shown, the detector output 62 is most positive when the call cord 22 is unplugged, and least positive when the call cord 22 is plugged in and the call cord switch 20 is activated.

Alternative circuit embodiments, such as inverting amplifier configurations, are also realizable, but require different computations. Similarly, a single semiconductor diode can perform substantially the function described, with an offset approximately equal to the rated forward drop of the diode. If a Schottky diode is used, then the forward drop is typically on the order of 0.2 volts for positive signals.

Figure 4:
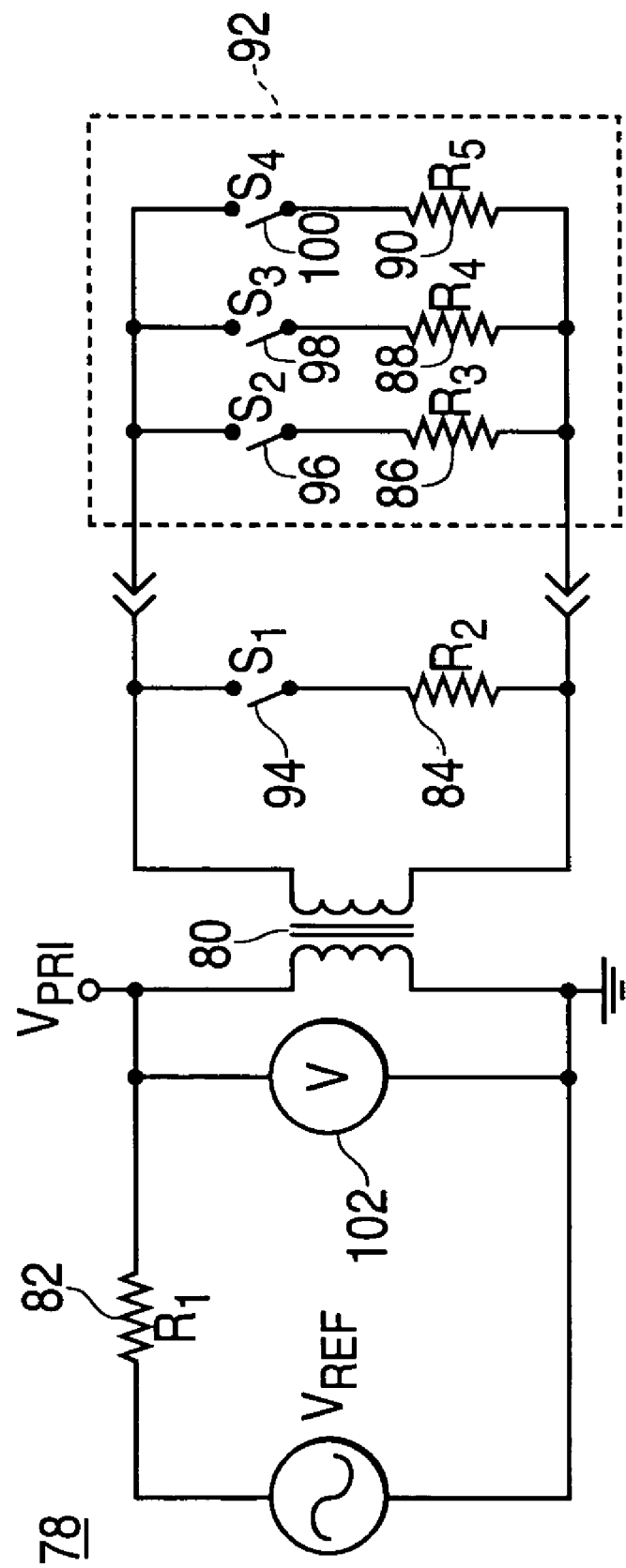
FIG. 4 is a schematic diagram of an alternate embodiment of the invention.

FIG. 4 shows that another configuration 78 can generate more logic states than the call cord configuration shown in FIGS. 1, 2, and 3. The configuration of FIGS. 1, 2, and 3 allows three logic states to be produced, namely, unplugged, plugged, and pressed. For convenience, in FIG. 4 the turns ratio of the transformer 80 is assumed to be 1:1. A first resistor 82 is assigned a resistance value 8R. If a second resistor 84 is also assigned a value 8R, a third resistor 86 a value 4R, a fourth resistor 88 a value 2R, and a fifth resistor 90 a value R, then leaving the call cord 92 unplugged still activates none of the switches 94, 96, 98, and 100. With the secondary open, the reference voltage $V_{REF}$ is present across a series string of the first resistor 82 and the primary of the transformer 80. This represents the nominal condition for the detection circuit.

Plugging in the call cord 92, which closes the cord sense switch 94, and omitting the contribution from the resistance of the transformer 80, an output of 0.5 $V_{REF}$ is obtained. Activating the first call cord switch 96 then produces an output of 0.25 $V_{REF}$, while activating the second switch 98 alone produces an output of 0.167 $V_{REF}$, and activating the first and second switches 96 and 98 together produces an output of 0.125 $V_{REF}$. Activating the last call cord switch 100, which has, in the embodiment shown, a resistor lower in value than the combination of all of the other resistors in parallel, produces an output closer to zero than any combination of other switch closures, and can thus serve as an override or emergency switch. If the output generated by activating one or more switches is rectified, filtered, and fed to a multiplicity of comparators with appropriate settings for their voltage thresholds, then a multiplicity of logic states can be extracted from the button-press status of the call cord switches. Thus, a multiplicity of information items can be extracted from a multifunction call cord, while the desirable degree of voltage isolation is preserved.

The final resistor 90 may have a resistance of zero ohms—that is, no resistance or no resistor at all—in which case pressing the last switch 100 results in largely the same behavior exhibited by the circuit in FIG. 2. This phenomenon may prevent the other switches from being detected while the last switch 100 remains pressed.

An additional resistance may be permanently positioned across the transformer 16 secondary winding in some embodiments.

Response speed is a function of oscillator frequency and component values. For many low-frequency oscillators, such as those that run at 32,768 Hz, response time with typical sense components may be a few thousandths of a second, and thus indistinguishable from instantaneous to a user. Other oscillator frequency regimes may be suitable for some embodiments.

The use of a sine wave signal has been noted herein as preferable. Alternatives to sine wave signals, such as ramp, square, and rectangular wave signals, and the like, have greater harmonic content than a sine wave. These harmonics, even at low amplitudes, can increase spurious radiation by the call cord, for example in event of a shield failure. At the opposite extreme, an approximate sine wave that has deliberately introduced, fairly low-rate frequency modulation to the extent of a few percent may show a lower effective level of detectable emission than a strictly steady-state signal. Other strategies, such as pseudo-random bursts of waveforms and/or $\cos^2 x$ amplitude modulation envelopes synchronized to the detectors, may also be effective at reducing effective emission levels.

A microprocessor/microcontroller/digital signal processor with a built-in or added-on analog-to-digital converter can accept either an unrectified AC input or a rectified DC version of the AC input for conversion. Such a microcontroller can then either mathematically convert the detected signal by discarding negative values and averaging positive values, for example, or can recognize positive peaks within a time window as indicative of switch status. A sample rate not less than the Nyquist rate is advisable for detecting positive peaks in a raw AC signal, while a peak detection provision such as an external rectifier/filter assembly can in some embodiments greatly reduce the required sample rate, depending on the time constant of the filter. An upper limit on the filter time constant may be established by determining how slow the detection of a switching event can be without appreciably degrading system functionality for a particular application.

Although an example of a voltage-isolated call cord detector is shown that uses multiple operational amplifiers and comparators, as well as a variety of discrete passive components, it will be appreciated that alternative devices, such as analog-to-digital converters, can produce substantially the same degree of ESD protection, provided the isolation transformer is employed largely as shown. Also, although the voltage-isolated call cord detector is useful in support of medical and related arts, it can also be used in other environments such as manufacturing, warehousing, and office environments where risk of damage to electronic devices due to ESD may be a principal consideration.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A detection circuit, comprising:
   a transformer primary circuit comprising:
      an alternating-current signal (AC) source;
      an impedance in series with said AC source;
      a transformer primary winding in series with said AC source and said impedance and establishing an electrical circuit by completing a signal path back to said AC source, wherein said transformer primary winding further comprises a primary winding on one of a ferrite core, an iron core, and a non-ferromagnetic core; and
      a detector positioned across one of said impedance and said primary winding; and
   a transformer secondary circuit comprising:
      a transformer secondary winding magnetically coupled to and electrically isolated from said transformer primary winding;
      a plurality of load devices switchably connected across said secondary winding
      a first load comprising a first load impedance and a call cord detection switch, wherein said first load impedance and said call cord detection switch are wired in series across said transformer secondary winding; and
      a second load comprising a call cord activations switch wired across said transformer secondary winding.

2. The detection circuit of claim 1, wherein said AC source is a signal generator capable of generating an approximate sine wave.

3. The detection circuit of claim 1, wherein said impedance further comprises one of a resistor, a capacitor, a resistor-capacitor network, an inductor, a transformer, an array of at least one diode, and a regulator device.

4. The detection circuit of claim 1, wherein one of said transformer primary winding and said transformer secondary winding is wound on one of a core and a bobbin fitted on a core common to said primary winding and said secondary winding.

5. The detection circuit of claim 1, wherein said detector further comprises a rectifier circuit positioned across one of said impedance and said transformer primary winding, the output of which rectifier circuit is a rectified form of an electrical signal developed across one of said impedance and said transformer primary winding.

6. The detection circuit of claim 5, wherein said rectifier circuit further comprises an ideal diode circuit, wherein an ideal diode circuit is a circuit capable of performing single-polarity rectification of an alternating-current input with substantially no offset at zero crossing.

7. The detection circuit of claim 5, wherein said detector further comprises a filter circuit to attenuate in said rectified electrical signal any signal content with a frequency outside a selected range of frequencies.

8. The detection circuit of claim 7, wherein said detector further comprises:
   a first level detector, the output of which is a logic signal that exists in a first-detector, first logic state when the electrical output of said filter circuit exceeds a first voltage threshold and exists in a first-detector, second logic state when the electrical output of said filter circuit is less than said first voltage threshold; and
   a first output signal driver, the output of which is a transmitted logic signal that tracks the electrical output of said first level detector.

9. The detection circuit of claim 7, wherein said detector further comprises:
   a second level detector, the output of which is a logic signal that exists in a second-detector, first logic state when the electrical output of said filter circuit exceeds a second voltage threshold and exists in a second-detector, second logic state when the electrical output of said filter circuit is less than said second voltage threshold; and
   a second output signal driver, the output of which is a transmitted logic signal that tracks the electrical output of said second level detector.

10. The detection circuit of claim 1, further comprising a combinatory multiplicity of switch-applied resistive loads across said transformer secondary winding, wherein each non-zero-ohm switched combination of loads there across has a nonduplicated resistive value.

11. The detection circuit of claim 10, wherein said detection circuit further comprises a multiplicity of level detectors having detection thresholds capable of allowing detection of said combinatory multiplicity of switch-applied resistive loads across said transformer secondary winding.

12. The detection circuit of claim 10, wherein said detection circuit further comprises a converter capable of identifying a multiplicity of detection thresholds corresponding to said combinatory multiplicity of switch-applied resistive loads across said transformer secondary winding.

13. A method for monitoring a call cord, comprising the steps of:
   generating a generally sinusoidal signal across a series string comprising an impedance and a primary winding of a transformer;
   establishing capability for detecting a voltage across one of the impedance and the primary winding of the transformer wherein the primary winding comprises at least one selected from the group consisting of ferrite core, iron core and a non-ferromagnetic core;
   electrically isolating a magnetically coupled secondary winding of the transformer from the primary winding of the transformer;
   providing a first load comprising a first load impedance and a call cord detection switch, wherein said first load impedance and said call cord detection switch are wired in series across said transformer secondary winding; and
   providing a second load comprising a call cord activation switch wired across said transformer secondary winding.

14. The method of claim 13, further comprising:
   sensing, by detection of a voltage across an element of a primary circuit of the transformer, one of an absence of any switched load, a presence of the first switched load, and a presence of the second switched load across the secondary winding of the transformer; and
   outputting a set of data signals that correspond to a sensed switched load status of the transformer secondary winding.

15. The method of claim 13, further comprising:
   establishing at least one additional switchable load across the secondary winding of the transformer;
   sensing, by detection of a voltage across an element of a primary circuit of the transformer, between an absence of any switchable load and a presence of each of a multiplicity of switchable loads across the secondary winding of the transformer; and
   outputting a set of data signals that correspond to a load status of a set of sensed, switched loads across the transformer secondary winding.

* * * * *